(12) United States Patent
Bleidistel et al.

(10) Patent No.: US 9,366,977 B2
(45) Date of Patent: Jun. 14, 2016

(54) SEMICONDUCTOR MICROLITHOGRAPHY PROJECTION EXPOSURE APPARATUS

(75) Inventors: Sascha Bleidistel, Aalen (DE); Olaf Conradi, Westhausen/Westerhofen (DE); Arif Kazi, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1115 days.

(21) Appl. No.: 13/289,560

(22) Filed: Nov. 4, 2011

(65) Prior Publication Data

US 2012/0069310 A1 Mar. 22, 2012

Related U.S. Application Data

(63) Continuation of application No. PCT/EP2009/003504, filed on May 16, 2009.

(51) Int. Cl.
| G03B 27/42 | (2006.01) |
| G03F 7/20 | (2006.01) |
| G02B 7/00 | (2006.01) |
| G02B 27/00 | (2006.01) |

(52) U.S. Cl.
CPC ........ *G03F 7/70891* (2013.01); *G03F 7/70308* (2013.01); *G02B 7/008* (2013.01); *G02B 27/0068* (2013.01)

(58) Field of Classification Search
CPC . G03F 7/70891; G03F 7/70308; G02B 7/008; G02B 27/0068
USPC .......................... 355/30, 53, 55, 67
See application file for complete search history.

(56) References Cited

U.S. PATENT DOCUMENTS

| 5,390,228 A | 2/1995 | Niibe et al. |
| 5,883,704 A * | 3/1999 | Nishi et al. ............... 355/67 |
| 6,081,388 A | 6/2000 | Widl |
| 6,198,579 B1 | 3/2001 | Rupp |
| 6,307,688 B1 | 10/2001 | Merz et al. |
| 6,521,877 B1 | 2/2003 | Müller-Rissmann et al. |
| 2001/0006412 A1 | 7/2001 | Karl-Heinz et al. |
| 2003/0021040 A1 | 1/2003 | Epple et al. |

(Continued)

FOREIGN PATENT DOCUMENTS

| DE | 198 24 030 A1 | 12/1999 |
| DE | 198 27 602 A1 | 12/1999 |

(Continued)

OTHER PUBLICATIONS

Machine translation of JP 10284390 A is attached to this Office Action.*

(Continued)

*Primary Examiner* — Mesfin T Asfaw
(74) *Attorney, Agent, or Firm* — Fish & Richardson P.C.

(57) ABSTRACT

The disclosure relates to an optical correction arrangement including at least one optical element and at least one irradiation mechanism for the targeted local irradiation of the optical element with electromagnetic heating radiation for the targeted local heating of the optical element. The optical correction arrangement also includes a mechanism for dissipating the thermal energy introduced into the optical element by the at least one irradiation mechanism. The disclosure furthermore relates to a projection exposure apparatus for semiconductor lithography including an optical correction arrangement according to the disclosure.

42 Claims, 6 Drawing Sheets

(56) References Cited

U.S. PATENT DOCUMENTS

| | | |
|---|---|---|
| 2003/0235682 A1 | 12/2003 | Sogard |
| 2004/0051984 A1* | 3/2004 | Oshino et al. ............... 359/845 |
| 2006/0244940 A1 | 11/2006 | Uehara |
| 2007/0019305 A1 | 1/2007 | Ulrich et al. |
| 2008/0123066 A1* | 5/2008 | Hendricus Jansen et al. .. 355/30 |
| 2008/0204682 A1* | 8/2008 | Uehara et al. ............... 355/46 |
| 2009/0046260 A1 | 2/2009 | Jansen |
| 2010/0201958 A1 | 8/2010 | Hauf et al. |
| 2011/0181852 A1 | 7/2011 | Bleidistel et al. |

FOREIGN PATENT DOCUMENTS

| | | |
|---|---|---|
| DE | 198 59 634 A1 | 6/2000 |
| DE | 10 2005 062401 | 6/2007 |
| DE | 10 2008 049 556.5 | 4/2010 |
| EP | 0 678 768 | 10/1995 |
| EP | 0 961 149 | 12/1999 |
| EP | 1 376 092 | 1/2004 |
| JP | 05-066297 | 3/1993 |
| JP | 05-190409 | 7/1993 |
| JP | 08-045827 | 2/1996 |
| JP | JP 9-232213 | 9/1997 |
| JP | 10-284390 | 10/1998 |
| JP | 2001-237180 | 8/2001 |
| JP | 2004-031958 | 1/2004 |
| JP | 2004-246343 A | 9/2004 |
| TW | 200903184 A | 1/2009 |
| TW | 200919111 A | 5/2012 |
| WO | WO 2004/036316 | 4/2004 |
| WO | WO 2006/128613 | 12/2006 |
| WO | WO 2008/122410 | 10/2008 |
| WO | WO 2008/122410 A2 | 10/2008 |
| WO | WO 2009/026970 | 3/2009 |

OTHER PUBLICATIONS

Japanese Office Action, with English translation thereof, for corresponding Appl No. 2012-510118, dated Apr. 23, 2013.

The International Search Report and a Written Opinion from the counterpart PCT Application No. PCT/EP2009/003504, mailed Feb. 1, 2010.

Taiwanese Office Action, with translation thereof, for TW Appl No. 099110702, dated Nov. 11, 2014.

* cited by examiner

SEMICONDUCTOR MICROLITHOGRAPHY PROJECTION EXPOSURE APPARATUS

CROSS-REFERENCE TO RELATED APPLICATIONS

This application is a continuation of, and claims priority under 35 USC 120 to, international application PCT/EP2009/003504, filed May 16, 2009, the contents of which are incorporated herein in their entirety.

FIELD

The present disclosure relates to a projection exposure apparatus which contains a projection objective which, in turn, contains an optical correction arrangement.

BACKGROUND

In modern projection objectives for microlithography, use is made of a large number of wavefront manipulators for the correction of optical aberrations. Most of these manipulators bring about a wavefront correction by mechanical manipulation of optical elements. This is done by a position change and/or by a deformation of the optical elements. These manipulators have correction possibilities for low-order wavefront aberrations such as typically occur when the objectives are used in conjunction with so-called conventional settings and at a throughput of approximately 120 wafers/hour.

However, constantly increasing desired throughput properties involve ever higher light intensities in the objective and hence a constantly rising thermal load that acts on the optical elements. This thermal load causes wavefront aberrations: in the case of lenses by way of the temperature-dependent refractive index and the surface deformation; in the case of mirrors predominantly as a result of the surface deformation on account of the thermal expansion of the mirror substrate. In addition, in the development of lithography, the trend is towards illumination settings, such as the dipole settings, for example, which entail a strong focusing of the light power density on, in particular, lenses near the pupil and therefore, on account of the resultant locally high thermal load, can also cause radial and/or azimuthal higher-order and highly localized wavefront aberrations.

One possibility of compensating for the wavefront aberrations caused by lifetime effects in a more efficient manner is currently the use of exchangeable plates to which special correction aspheres are applied. Within the lifetime of the objective, these compensation plates can be exchanged repeatedly in order to cope appropriately with the changes in the wavefront aberrations during the lifetime of the objective.

Although compensation plates with correction aspheres can compensate for aberrations, they are rather unsuitable for the compensation of dynamically rapidly variable aberrations. Moreover, the aberration to be compensated for has to be known before the creation of the compensation plate, and in particular therefore before the compensation plate is incorporated into the projection objective. Since new wavefront aberrations are in turn induced by the incorporation of the compensation plate, naturally complete compensation is not possible here.

As already mentioned, mechanical manipulators are known. Thus, DE 198 24 030 A1, for example, describes a catadioptric projection objective with adaptive mirrors, wherein mirrors can be deformed by actuating elements in such a way that specific image aberrations are reduced.

EP 678 768 and DE 198 59 634 A1 likewise disclose projection exposure apparatuses in which lenses or mirrors are deformed by actuators for image aberration correction.

Since mechanical elements in the optical beam path cause shading and scattered light, however, mechanical concepts, in the case of lenses to be manipulated, are restricted to the manipulation of the lens edge. This restriction to the lens edge can constitute an inherent limitation of the possible correction profiles, and especially of the radial orders, which is unable to be circumvented even by complex mechanisms.

As an alternative to the mechanical manipulators, thermal manipulators are known, wherein the thermal manipulators are likewise arranged at the lens edge, such as in the U.S. Pat. No. 6,198,579 B1, for example. However, the thermal manipulators proposed in the cited document can exhibit the same limitations in the radial orders as their mechanical counterparts and additionally imply relatively long time constants given by the propagation speed of the heat over the lens diameter. Edge-actuated thermal manipulators are therefore predominantly suitable for compensation of temporally steady-state wavefront aberrations. On account of the long time constants, however, such manipulators may be suitable only to a very limited extent for the compensation of transient wavefront aberrations.

Furthermore, a method for the correction of non-rotationally symmetrical image aberrations with Peltier elements arranged at the periphery of lenses is known from DE 198 27 602 A1, wherein the Peltier elements influence the thermal behavior of the optical element in such a way that in the case of non-rotationally symmetrical passage of radiation through the element, resultant imaging aberrations can be corrected.

A device and a method for the correction of asymmetrical thermal loads of an optical element such as a lens or a mirror are likewise known from DE 198 59 634 A1, wherein the optical element is likewise deformed by actuators. It is likewise known from U.S. Pat. No. 6,081,388 to deform surfaces of lenses by actuators or defined mechanical forces in such a way that the imaging aberrations are influenced.

Furthermore, it is known from U.S. Pat. No. 6,521,877 B1 to influence the temperature of an optical element locally by transparent resistive layers. An alternative approach is disclosed in U.S. Pat. No. 6,466,382 B2, which proposes applying on a lens layers having absorbent properties which have a structure complementary to the footprint of the useful light.

The documents US2007/0019305 A1, US2003/0021040 A1, WO2006/128613 A1, JP2004/246343 A1, EP0678768 A2, U.S. Pat. No. 6,198,579 B1 and DE 10 2005 062401 A1 disclose further concepts for improving the imaging properties of optical systems such as e.g. projection objectives for semiconductor lithography.

WO 2004/036316 discloses a method for the correction of imaging aberrations of optical elements such as mirrors and lenses wherein, by additional irradiation, the temperature of the optical elements is altered in such a way that the imaging aberrations are reduced. However, the temperature of the optical elements can increase overall as a result of the additional irradiation, which can have a negative effect on the possibilities for using the concept disclosed in the cited document; in particular the disturbance of adjacent lenses and structures (mounts, manipulators, . . . ). The effect can be significantly increased imaging/wavefront aberrations.

A further document that realizes the refractive index and/or the shape of a lens by thermal influencing of the lens is US2006/0244940 A1, wherein infrared light is radiated laterally into the lens to be thermally influenced. However, this can involve a constrained arrangement of the optical waveguides outside the optically utilized area of the lens, and thus also the a priori far distance of the manipulator from the lens to be manipulated. In particular the indefinite heat dissipation of the lens manipulated in this way is disadvantageous.

SUMMARY

The present disclosure provides a projection exposure apparatus for semiconductor lithography in which a controlled or regulated choice of the correction properties is possible in conjunction with high flexibility and with minimum effects on the optical performance of the projection exposure apparatus.

The projection exposure apparatus according to the disclosure can include an arrangement including at least one optical element and at least one irradiation mechanism for the targeted local irradiation of the optical element with electromagnetic radiation for the targeted local heating of the optical element. This electromagnetic radiation for heating the optical element is also referred to hereinafter as heating radiation, in order to distinguish it from the electromagnetic radiation that serves for imaging in the projection exposure apparatus. The latter radiation is also referred to as useful radiation. According to the disclosure, a mechanism is present for dissipating the thermal energy introduced into the optical element by the at least one irradiation mechanism.

The mechanism for dissipating the thermal energy can involve in particular mechanism for forming a fluid flow which passes at least one surface of the optical element.

For this purpose, the optical element can have two optical partial elements, in particular two plane-parallel plates, which are arranged adjacent and between which is formed a channel through which the fluid flow can flow.

The fluid flow can be oriented parallel to the surface of the optical element or alternatively have a direction component which is oriented perpendicular to the surface of the optical element.

The electromagnetic heating radiation can run through the fluid flow.

Furthermore, the electromagnetic heating radiation can be directed onto the two channel-forming surfaces of the optical partial elements.

In an alternative embodiment of the disclosure, the optical element has at least two partial elements which are in thermal contact with one another and of which the second has a higher thermal conductivity than the first. The second partial element can be in thermal contact with a heat sink, which ultimately forms the mechanism for dissipating the thermal energy introduced. The first partial element can contain quartz glass, and the second partial element can contain $CaF_2$.

The heating radiation can be directed onto that side of the first partial element which is removed from the second partial element, or else onto that surface of the first partial element which is thermally linked to the second partial element.

Furthermore an absorption layer for absorbing the heating radiation can be arranged on one of the optical partial elements. The absorption layer can be arranged between the first and the second optical partial element.

In a further embodiment of the disclosure, the projection exposure apparatus can be an EUV projection exposure apparatus. In such an embodiment, the optical element is embodied as a mirror of the projection exposure apparatus. The desired correction effect can be achieved by the additional thermal deformation of the mirror surface that is induced in the mirror by the heating radiation.

For dissipating the thermal energy, channels can be involved, for example, through which a cooling medium can flow and which are worked into the mirror substrate of the mirror.

In addition, it is also conceivable for the mechanism for dissipating the thermal energy to be thermally conductive solids which can be embodied for example as additional elements such as fibers or heat conducting strips. In addition, it is also conceivable to supplement the solid components that are already present and that are linked to the mirror, such as kinematic elements, bearing elements or actuators, for example, by the further functionality of heat dissipation or to utilize their thermally conductive properties for dissipating the thermal energy.

In addition, the energy can also be dissipated by radiative elements or by a fluid flow which passes the mirror and which is formed for example by argon or hydrogen at a pressure of a plurality of pascals, in particular 3 to 4 pascals.

Possible embodiments for dissipating the thermal energy are disclosed in the German Patent Application DE 10 2008049556.5, in particular in FIGS. 1-9 together with the associated description. The entire contents of German Patent Application DE 10 2008049556.5 are incorporated by reference in the present application. In the case of discrepancies between the disclosure of the present application and that of German Patent Application DE 10 2008049556.5, the disclosure of the present application is applicable.

In a further variant of the disclosure, a mechanism is present for the further manipulation of those portions of the heating radiation which are not absorbed by the optical element. In this case, the mechanism for further manipulation can be embodied for example as an absorbent element, wherein the absorbent element can be arranged in one instance in the interior of a housing of the projection exposure apparatus. In addition, there is the possibility of arranging the absorbent element outside the housing of the projection exposure apparatus; in this case, it is advantageous to provide a window in the housing of the projection exposure apparatus which allows the non-absorbed heating radiation to pass in the direction of the absorbent element.

The non-absorbed heating radiation can additionally or alternatively also be manipulated by reflection. This can be effected for example by the virtue of the fact that reflective elements are present which reflect the non-absorbed portions of the heating radiation back onto the optical element or else direct them onto further optical elements.

In order to optimize the correction effect of the projection objective according to the disclosure, a control unit connected to an image sensor can furthermore be provided, by which the parameters of the heating radiation, such as direction and/or intensity, for example, or else the properties of the mechanism for dissipating the energy introduced can be influenced, whereby the correction effect can be adapted and improved in a situation-dependent manner.

The disclosure is explained in more detail below on the basis of some exemplary embodiments.

DETAILED DESCRIPTION

Figure 1:
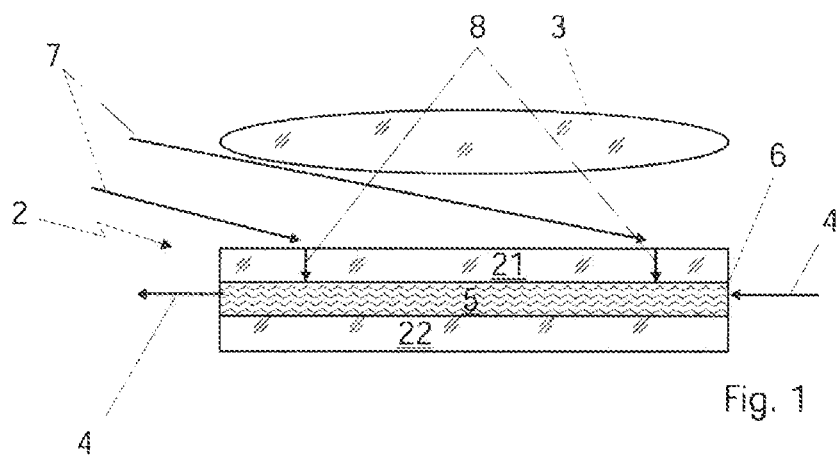
FIG. 1 shows a first embodiment of the disclosure.

FIG. 1 shows a first embodiment of the disclosure, in which the optical element 2 is formed from the two partial elements 21 and 22. In the present example, the two partial elements 21 and 22 are formed as plane-parallel plates composed of quartz glass.

A channel 6 through which a fluid flow of the cooling fluid 5 can flow is formed between the two partial elements 21 and 22. In this case, the direction of the fluid flow is indicated by the arrows 4.

As an alternative to this, in a manner not illustrated in FIG. 1, the two partial elements 21 and 22 can also be embodied in such a way that only the channel 6 is bounded by two plane surfaces. This has the advantage that the optical effects of the two optical partial elements 21 and 22 are freely selectable to a certain degree. Thus, in particular the refractive powers of the optical partial elements can be freely selected in such a case.

In the present case, the heating radiation 7 is directed onto that side of the first partial element 21 which is remote from the second partial element 22. The heating radiation 7 is incident at a shallow angle (relative to the surface) on that surface of the first partial element 21 which is remote from the second partial element 22, such that the heating radiation 7 does not impinge on an optical element 3 which is adjacent to the first partial element 21. It becomes clear from FIG. 1 that the reflected portion (not illustrated in FIG. 1) of the radiation 7, on account of the shallow angle of incidence, which results in the same shallow angle as angle of reflection, is not incident on the adjacent optical element 3 either and therefore likewise causes no unintentional thermal influencing of the optical element 3. The regional absorption of the heating radiation 7 on the surface of the partial element 21 results in a first temperature gradient in the direction of the cooling fluid 5, the temperature gradient being indicated by the arrows 8.

In addition second thermal gradients result if the heating radiation is applied in a locally resolving manner. Those second gradients have non-vanishing components orthogonal to the above temperature gradient. In accordance with the above first temperature gradient, a heat flow takes place in the direction of the arrows 8; the heat conducted in the direction of the cooling fluid 5 is taken up by the cooling fluid and transported away with the fluid flow. This affords the possibility of locally introducing temperature gradients into the partial element 21, whereby an optical correction effect of the plane-parallel plate 21 can be achieved. Moreover since the dissipated energy is transported away one can achieve a steady state of non-vanishing gradients. Since the thermal energy is introduced into the beam path of the projection exposure apparatus by heating radiation and not by heating elements arranged inside the beam path of useful radiation, it can be assumed that any impairment of the optical performance of the projection exposure apparatus on account of the heating, which is not caused by the absorbtion of the heating radiation, is practically negligible.

The refractive index gradient caused by the temperature gradient influences the optical path length or the phase in partial element 21. The optical correction effect of the optical element 2 is achieved by this approach.

By way of example, the cooling fluid 5 used can be a purge gas which is already used in the projection objective and by which the remaining components of the objective are also cooled. $H_2$, $N_2$, helium or dry, high-purity air could be mentioned here by way of example. It goes without saying that other gases or alternatively liquids such as water, in particular, are also appropriate for this.

In the present case, radiation having a wavelength of greater than 2 μm, in particular greater than 4 μm, can be used for the heating radiation 7. By way of example, a $CO_2$ laser having an emission wavelength in the region of approximately 10.6 μm is appropriate here as a radiation source. In addition, in the case of using an optical partial element composed of quartz glass, it is also possible to choose a wavelength of less than approximately 180 nm for the heating radiation 7 since the quartz glass also has absorbent properties in this wavelength range. The optical useful radiation in the case of using quartz glass for the partial element 21 can have a wavelength of greater than 190 nm. For the case where the glass used for the optical partial element 21 has an OH concentration of greater than 500 ppm, a heating radiation 7 having a wavelength within the range of between approximately 2.65 μm and 2.85 mm can also be employed, since an OH absorption peak is located in this range.

In case of $CaF_2$ is used for the optical element that absorbs the heating radiation, it is recommended to use electromagnetic radiation having a wavelength of less than approximately 160 nm or greater than 9 μm for the heating radiation.

Furthermore, a heating radiation having a wavelength of less than 350 nm or greater than 2 μm, in particular greater than 2.5 μm, can advantageously be employed for optical elements composed of optical glasses for a useful wavelength of the projection exposure apparatus (that is to say for that wavelength which is used for the exposure of the wafer) of greater than 350 nm.

Figure 2:
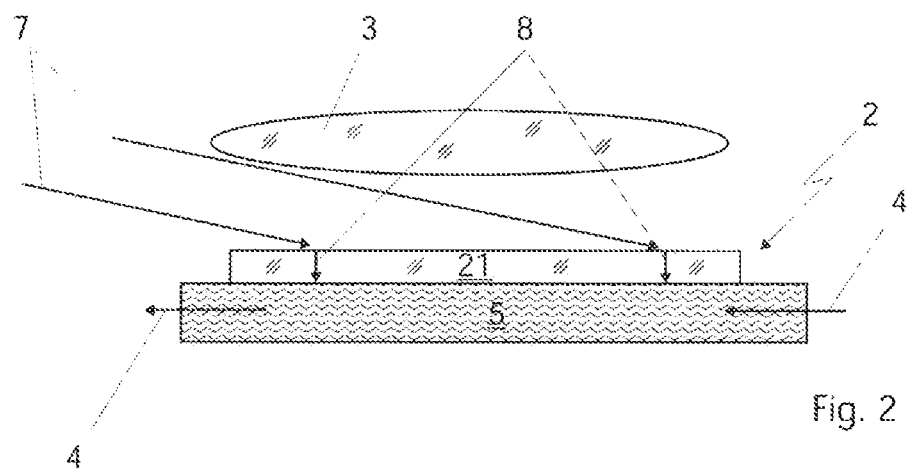
FIG. 2 shows a variant of the disclosure which is suitable in particular when gaseous fluids are used.

FIG. 2 illustrates a variant of the disclosure which is suitable in particular when gaseous fluids are used as cooling fluids 5.

In the present case, the optical element 2 only has the first optical partial element 21, past which a gas flow as a fluid flow (once again indicated by the arrows 4) is led substantially parallel to a surface of the partial element. The arrangement is otherwise unchanged with respect to the embodiment illustrated in FIG. 1. The already used purge gas of a projection objective can be used in the case illustrated in FIG. 2, the gas being led with a preferably increased mass flow rate past the optical partial element 21 approximately parallel to the surface thereof.

The simpler construction of this arrangement by comparison with the first exemplary embodiment is advantageous in this case.

Figure 3:
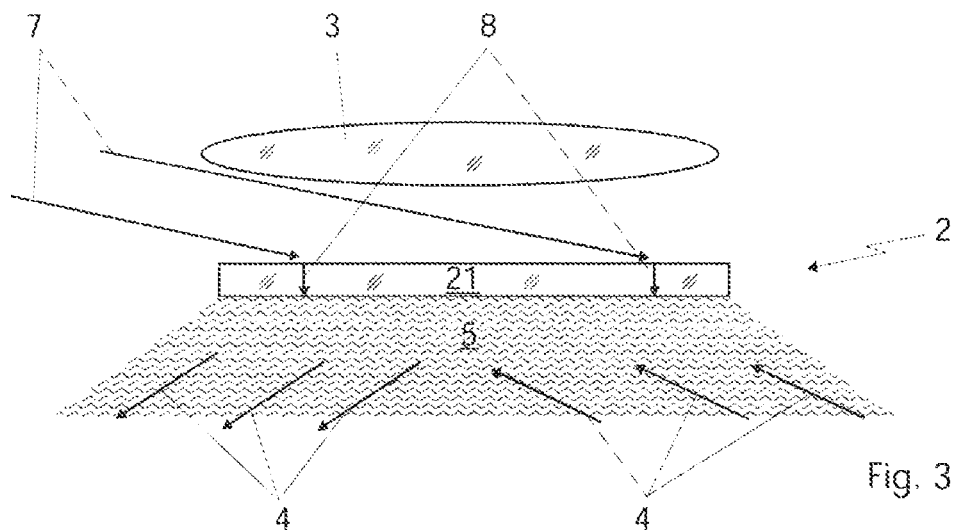
FIG. 3 shows an embodiment of the disclosure in which the fluid flow has a component of its direction of movement toward a surface of an optical partial element.

In a variant of the embodiment illustrated in FIG. 2, the fluid flow can have a component of its direction of movement which is orthogonal to a surface of the partial element 21, as indicated by the arrows 4 in FIG. 3. Although FIG. 3 illustrates that the fluid flow 4 impinges on the entire side of the partial element 21 that is remote from the heating radiation 7, it is equally possible for the fluid flow 4 to impinge on a surface of the partial element 21 only locally (not illustrated). If this localness is conFigured in variable fashion, for example by local flowing with a gas as fluid flow 4, this results in further degrees of freedom with regard to the formation of a temperature gradient in the partial element 21.

Figure 4:
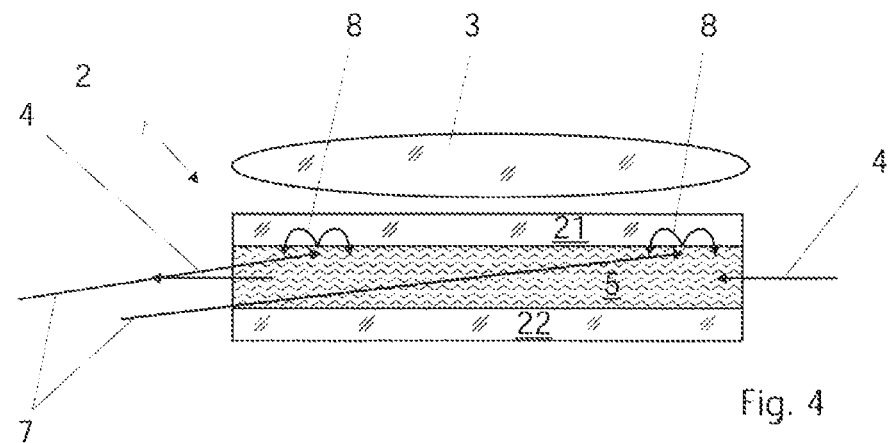
FIG. 4 shows a variant of the disclosure in which the heating radiation impinges through the fluid flow on that surface of an optical partial element which faces the fluid flow.

FIG. 4 shows an embodiment of the disclosure in which the electromagnetic heating radiation 7 is incident through the fluid flow on that surface of the partial element 21 which faces the fluid flow.

This measure has the effect that the temperature gradient induced by the optical heating radiation, the temperature gradient likewise being indicated in FIG. 4 by the arrows 8, does not necessarily reach that side of the partial element 21 which is remote from the fluid flow 4. In other words, the temperature distribution can be homogeneous on that side of the partial element 21 which is remote from the fluid channel, whereas it has the desired gradient on that surface of the partial element 21 which faces the fluid flow 4. The optical correction arrangement 1 is therefore thermally neutral toward the outside, whereby the disturbance potential of such a component in a projection objective is considerably reduced.

It is advantageous in this case if the cooling fluid 5 has a highest possible transmittance for the wavelength of the heating radiation 7. This is generally applicable for the above-mentioned purge gases that are used in projection objectives.

Figure 5:
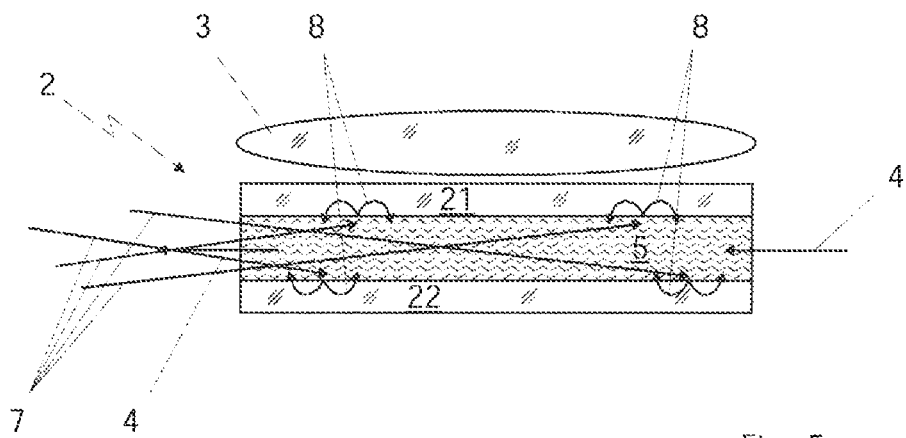
FIG. 5 shows a modification with respect to FIG. 4 in which the heating radiation impinges on both surfaces of the partial elements that face the fluid flow.

FIG. 5 shows a variant with respect to FIG. 4 in which the heating radiation 7 impinges on both surfaces of the partial elements 21 and 22 that face the fluid flow.

This opens up the possibility of realizing an optical correction arrangement which is likewise thermally neutral toward the outside. For this purpose, by way of example, constant cooling can be effected by the fluid flow and the two optical partial elements 21 and 22 can be heated to the objective temperature with the aid of the heating radiation 7. The two partial elements 21 and 22 therefore appear thermally neutral toward the outside. Since both partial elements are now heated, firstly it is possible to obtain a higher number of degrees of freedom of manipulation, and secondly it is also possible to achieve an increase in the manipulator range, which rises with the energy of the heating radiation that can be input overall.

Figure 6:
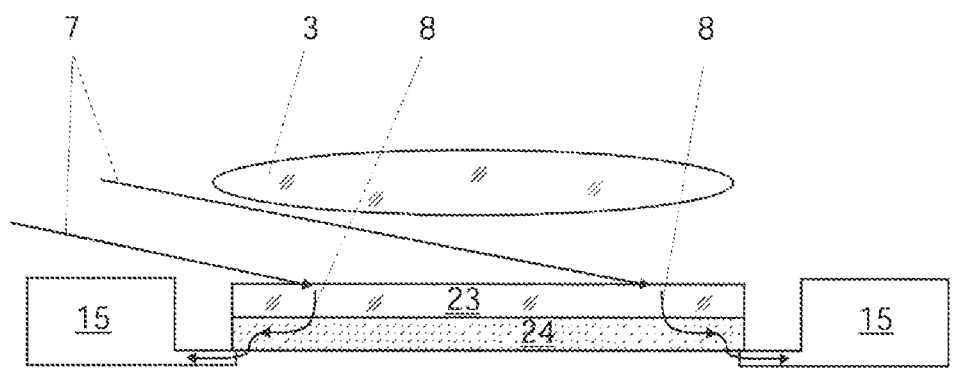
FIG. 6 shows a further embodiment of the disclosure in which the optical element has two partial elements that are in thermal contact with another.

FIG. 6 shows a further embodiment of the disclosure in which the optical element 2 has the two partial elements 23 and 24 that are in thermal contact with one another.

In the present example, the first partial element 23 is formed from an optical material that absorbs the heating radiation 7, such as quartz glass, for example, whereas the second optical partial element 24 is formed from optical material having better thermal conductivity relative to the quartz glass, such as $CaF_2$, for example. This material pairing is suitable particularly for objectives having a useful wavelength ≥193 nm. In this case, too, a temperature gradient forms in the first partial element 23 and causes a refractive index gradient that in turn influences the optical path length or the phase of the useful light.

In this case, the temperature gradient is once again indicated by the arrows 8. The temperature gradient and with it the heat flow run from the first partial element 23 through the second partial element 24 into the mount 15, which serves as a heat sink. In this case, the mount 15 can be provided with a additional cooling device/thermal sink (not illustrated).

The heating radiation 7 locally impresses a heat flow that has a non-vanishing component that flows through the first partial element 23 in the axial direction in the direction of the second partial element 24 as indicated by the arrow 8. In this way, a large temperature increase arises locally in the first partial element 23 on account of the low thermal conductivity thereof. Since the second partial element 24 has a high thermal conductivity rate ($CaF_2$ has a thermal conductivity seven times higher than that of quartz), it conducts away the impressed heat flow in the direction of the arrow 8 radially to the heat sink 15 at the edge of the optical element 2. In this case, a temperature increase that arises in the partial element 24 is significantly smaller than that in the partial element 23.

The local temperature increase in the partial element 23 (lower thermal conductivity) leads there to a local change in the refractive index. This effect is also manifested in the second partial element 24, but it is manifested to a considerably smaller extent on account of this partial element being heated to a significantly smaller extent.

Figure 7:
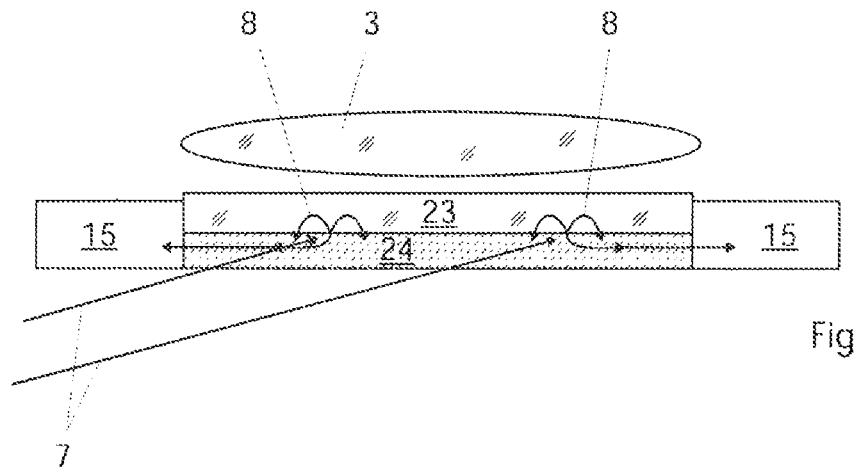
FIG. 7 shows a modification with respect to FIG. 6 in which the heating radiation is directed onto that surface of the first partial element which is thermally linked to the second partial element.

FIG. 7 illustrates a variant of the disclosure in which the heating radiation 7 is directed on to that surface of the first partial element 23 which is thermally linked to the second partial element; in other words, the heating radiation 7 is radiated to the second partial element 24. For this purpose, it is advantageous to select a wavelength of the heating radiation 7 in the range >2 µm, in particular >4 µm and <9 µm.

A CO laser having an emission wavelength of 5.3 µm is therefore particularly appropriate as a source for the heating radiation 7.

Figure 8:
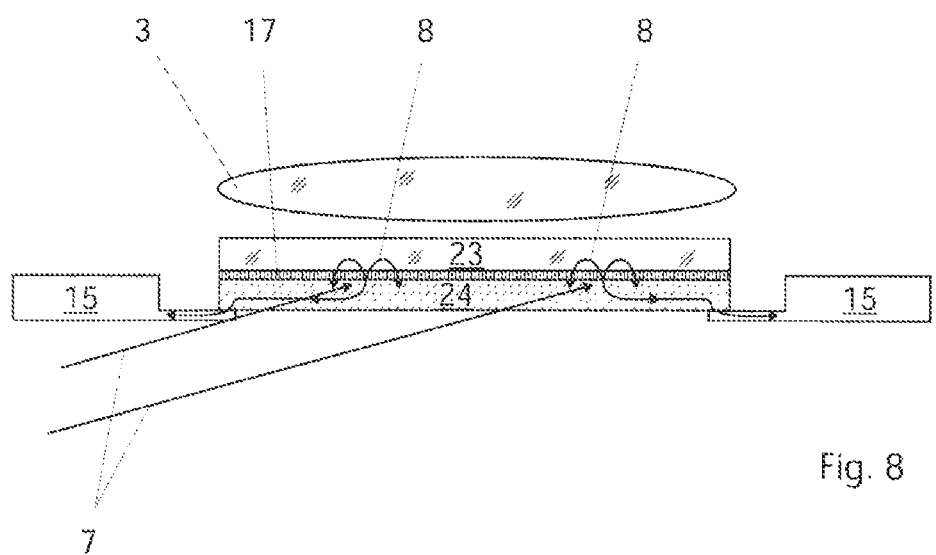
FIG. 8 shows a further embodiment of the disclosure in which an absorption layer for absorbing the heating radiation is arranged between the first partial element and the second partial element.

FIG. 8 shows a further embodiment of the disclosure in which an absorption layer 17 for absorbing the heating radiation 7 is arranged between the first partial element 23 and the second partial element 24.

The absorption layer 17 can be used in particular for heating radiation in wavelength ranges which are not absorbed well enough by quartz glass, such that a significant alteration of the refractive index of the quartz glass would result, or for the case where the same material is used for the two optical partial elements 23 and 24. However, one desirable feature of the absorption layer 17 is that it desirably has a sufficiently good transmission for the useful wavelength of the projection exposure apparatus.

For the case where the useful wavelength is in the region of 193 nm, a wavelength of less than 180 nm should be selected for the heating radiation. Thus, e.g. for an absorption layer 17 arranged between two partial elements composed of $CaF_2$ and quartz glass, the heating wavelength should be selected within the range of approximately 155 nm to approximately 180 nm.

In addition, it is also conceivable to select the wavelength of the heating radiation within the range of the wavelength of the useful radiation.

In this case, however, there is the limitation that the absorption in the optical correction arrangement is comparatively low.

Figure 9:
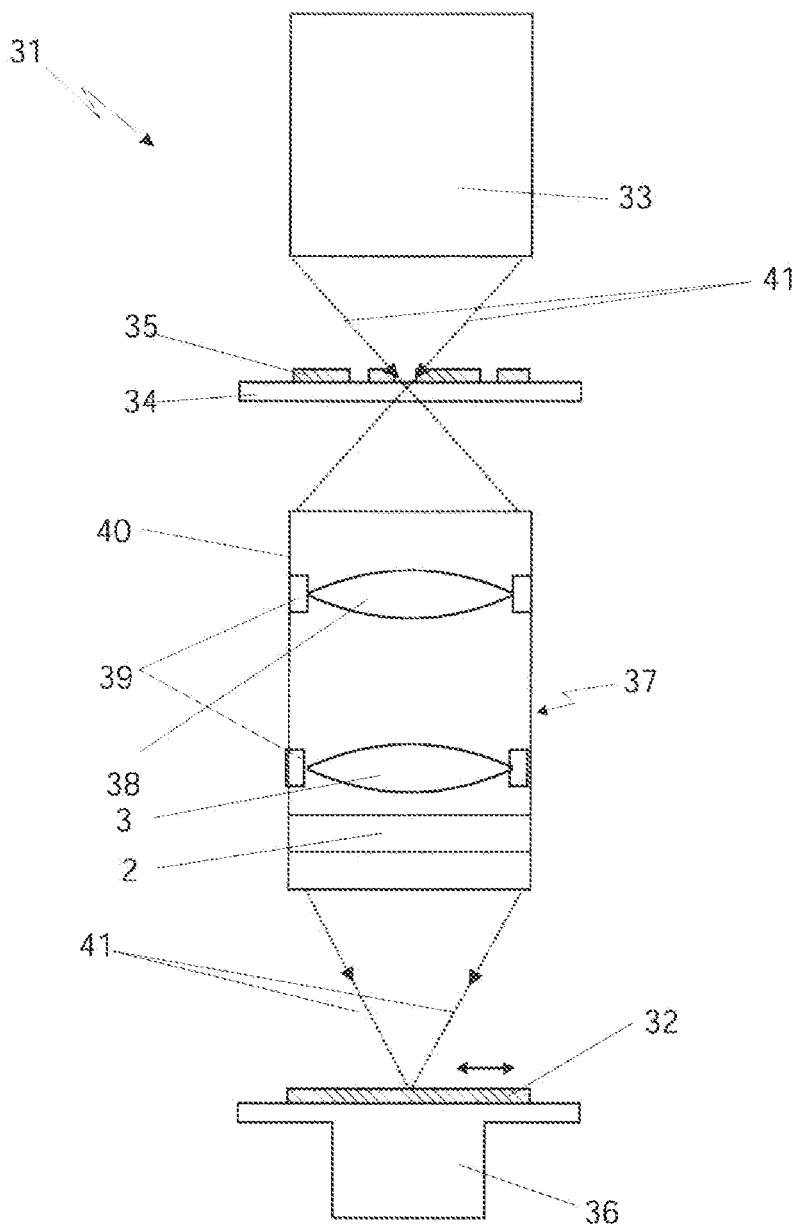
FIG. 9 shows a projection exposure apparatus for semiconductor lithography into which the correction arrangement described is integrated.

FIG. 9 illustrates a projection exposure apparatus 31 for semiconductor lithography into which is integrated the described correction arrangement with the optical element 2. It serves for the exposure of structures onto a substrate coated with photosensitive materials, the substrate generally being composed predominantly of silicon and being referred to as a wafer 32, for the production of semiconductor components, such as e.g. computer chips.

In this case, the projection exposure apparatus 31 essentially includes an illumination device 33, a device 34 for receiving and exactly positioning a mask provided with a structure, a so-called reticle 35, which is used to determine the later structures on the wafer 32, a device 36 for retaining, moving and exactly positioning precisely the wafer 32, and an imaging device, namely a projection objective 37, having a plurality of optical elements 38 that are borne by mounts 39 in an objective housing 40 of the projection objective 37. In this case, it is possible to arrange a correction arrangement according to the disclosure with an optical element as illustrated at any desired location in the projection objective 37 or alternatively in the illumination device 33. Two locations in the projection objective 37 are prefererred to arrange the correction device: places near to pupil planes and near to field planes respectively. Here an optical device is understood to be near a pupil plane or field plane of the projection objective 37 if there is no other optical device more near to that pupil plane or field plane respectively.

In this case, the basic functional principle provides for the structures introduced into the reticle 35 being imaged onto the wafer 32; the imaging is generally performed in demagnifying fashion.

After an exposure has taken place, the wafer 32 is moved further in the arrow direction, with the result that a multiplicity of individual fields each having the structure prescribed by the reticle 35 are exposed on the same wafer 32. On account of the step-by-step advancing movement of the wafer 32 in the projection exposure apparatus 31, the latter is often also referred to as a stepper. In addition, so-called scanner systems, in which the reticle 35 is imaged during a joint movement with the wafer 32 in scanning fashion on the wafer 32, are also in widespread use.

The illumination device 33 provides a projection beam 41 used for the imaging of the reticle 35 on the wafer 32, for example light or a similar electromagnetic radiation. A laser or the like can be used as a source for this radiation. The radiation is shaped in the illumination device 33 by optical elements in such a way that the projection beam 41, upon impinging on the reticle 35, has the desired properties with regard to diameter, polarization, shape of the wavefront and the like.

Via the beams 41, an image of the reticle 35 is generated and is transferred to the wafer 32 in correspondingly demagnified fashion by the projection objective 37, as has already been explained above. The projection objective 37 has a multiplicity of individual refractive, diffractive and/or reflective optical elements 38, such as e.g. lenses, mirrors, prisms, terminating plates and the like.

Figure 10:
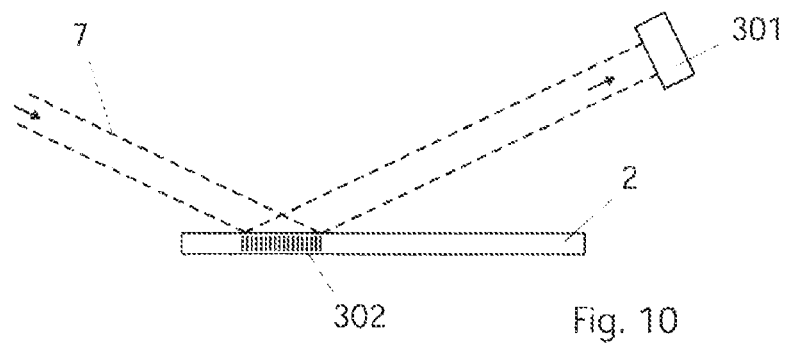
FIG. 10 shows an embodiment of the disclosure in which a first possibility for the further manipulation of those portions of the heating radiation which are not absorbed by the optical element is realized.

FIG. 10 shows an embodiment of the disclosure which realizes a first possibility for the further manipulation of those portions of the radiation 7 which are not absorbed by the optical element 2. In this case, the incident radiation 7 impinges on the region 302 of the optical element 2. A specific portion of the radiation 7 is absorbed in the region 302 and thus contributes to the heating of the region 302. The desired correction effect of the optical element 2 is thereby achieved. It is usually the case, however, that the incident radiation 7 is not absorbed in its entirety in the region 302, but rather a specific portion of the radiation 7 is scattered or reflected. The ratio of the portions of the reflected radiation to the portions of the absorbed radiation depends in this case in particular on the angle of incidence, the polarization of the incident radiation and the surface constitution and material selection of the optical element 2. It is desirable to manipulate the non-absorbed portion of the incident radiation 7 to the effect that it does not lead to undesirable disturbances elsewhere. For this purpose, the non-absorbed portion of the radiation 7 can be absorbed by the absorber 301, which prevents the situation in which further reflection or scattering takes place in the system and the portion not absorbed in the optical element 2 is absorbed by other components of the optical system in an uncontrolled manner. In this case, the absorber 301 can be embodied as a baffle with tips or as material with a structured surface or as a body with an absorbent layer. The controlled absorption of that portion of the radiation 7 which is not absorbed in the optical element 2 has the effect that the radiation 7 can be incident on the optical element 2 at comparatively shallow angles. In this case the non-absorbed part of the heating radiation extends in general the absorbed portion of the heating radiation and can be effectively neutralized by the absorber 301 and therefore does not lead to undesirable effects like being absorbed by optical devices different from the optical element 2. The shallower angle of incidence that can be realized in this way makes it possible to significantly reduce the additional structural space in the objective in direction of useful radiation.

Figure 11:
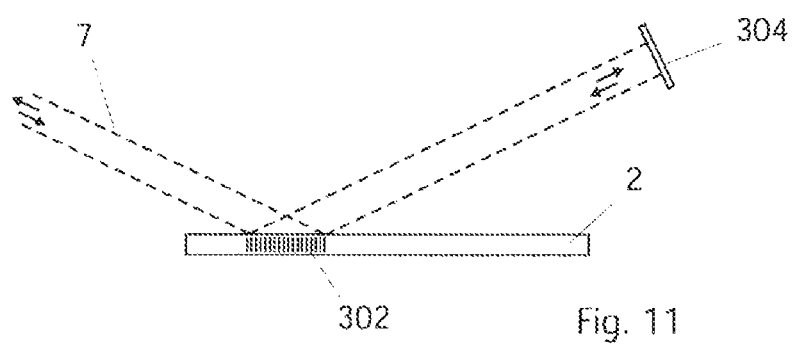
FIG. 11 shows a further variant of the disclosure in which a reflector is used instead of the use of an absorber, with the construction otherwise changed.

FIG. 11 shows a further variant of the disclosure in which a reflector 304 is used instead of the use of an absorber, with the construction otherwise unchanged. The reflector 304 reflects that portion of the radiation 7 which is not absorbed in the optical element 2 back into the region 302, with the result that the optical element 2 is heated by the radiation 7 with an increased efficiency by comparison with a solution without a reflector.

Figure 12:
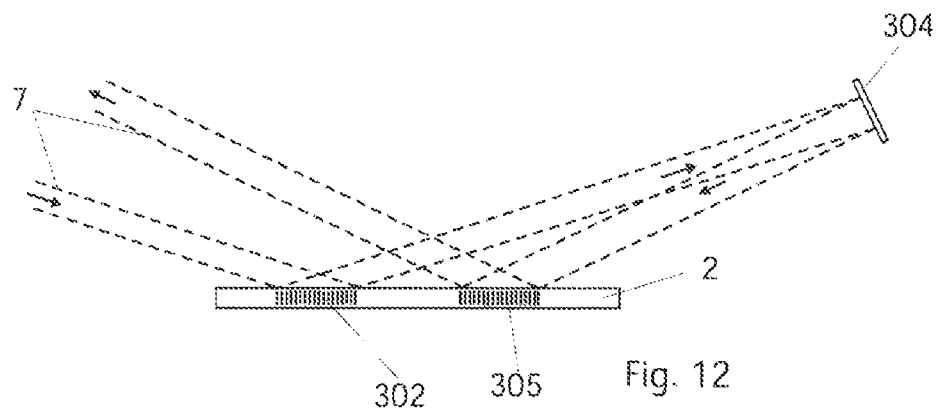
FIG. 12 shows a variant of the solution illustrated in FIG. 11.

The non-absorbed radiation need not necessarily be reflected back into the heated region 302 of the optical element 2 by the reflector 304. By correspondingly tilting the reflector 304, it is likewise possible for a further region 305 of the optical element 2 to be heated, as illustrated in FIG. 12. In this case, the regions 302 and 305 can spatially be separate from one another, adjoin one another or else overlap. The heat input at the different heated regions 302 and 305 can be influenced in a targeted manner by taking account of angle-dependent absorption properties of the optical element 2 in the design of the system.

In principle, the possibilities shown for the further manipulation of non-absorbed portions of the radiation 7 are not restricted to a shallow angle of incidence of the radiation 7; rather, the solutions described in FIGS. 10 to 12 can advantageously be employed for practically all conceivable angles of incidence.

What is claimed is:

1. An apparatus, comprising:
   a first optical element;
   a first mechanism configured to heat the first optical element by irradiating the first optical element with heating radiation;
   a second mechanism configured to flow a fluid along a surface of the first optical element to dissipate heat from the first optical element; and
   a member,
   wherein:
      during use of the apparatus, the heating radiation passes through the fluid before reaching the first optical element;
      the apparatus is a semiconductor microlithography projection exposure apparatus; and the member is selected from the group consisting of:
an absorbent element configured to absorb the heating radiation, the absorbent element being configured to absorb portions of the heating radiation not absorbed by the first optical element; and
reflective elements configured to direct non-absorbed portions of the heating radiation onto the first optical element or different components of the apparatus.

2. The apparatus of claim 1, wherein the fluid comprises a gas.

3. The apparatus of claim 2, wherein the gas comprises hydrogen and/or argon.

4. The apparatus of claim 2, wherein, during use of the apparatus, the gas has a pressure of from 3 to 4 pascals.

5. The apparatus of claim 1, further comprising a second optical element, wherein the second mechanism is configured so that the fluid flows between the first and second optical elements during use of the apparatus.

6. The apparatus as of claim 5, wherein:
the first optical element has a first plane surface;
the second optical element has a second plane surface; and
the second mechanism is configured so that, as the fluid flows between the first and second optical elements during use of the apparatus, the fluid is bordered by the first and second plane surfaces.

7. The apparatus of claim 5, wherein a first surface of the first optical element and a second surface of the second optical element define a channel through with the fluid flows during use of the apparatus, and the first mechanism is configured so that the heating radiation is directed onto the first and second surfaces.

8. The apparatus of claim 1, wherein the fluid flows parallel to a surface of the first optical element during use of the apparatus.

9. The apparatus of claim 1, wherein a direction of the fluid flow has a component which is oriented perpendicular to the surface of the first optical element during use of the apparatus.

10. The apparatus of claim 1, further comprising a heat sink, wherein:
the first optical element comprises first and second partial elements thermally contacting each other;
the second partial element has a higher thermal conductivity than the first partial element; and
the heat sink and the second partial element dissipate heat from the first optical component during use of the apparatus.

11. The apparatus of claim 10, wherein the second partial element comprises calcium fluoride.

12. The apparatus of claim 11, wherein the first partial element comprises quartz glass.

13. The apparatus of claim 10, wherein the heating radiation is directed onto a side of the first partial element which is remote from the second partial element.

14. The apparatus of claim 10, wherein the heating radiation is directed onto a surface of the first partial element which is thermally linked to the second partial element.

15. The apparatus of claim 10, further comprising an absorption layer configured to absorb the heating radiation, wherein the absorption layer is supported by one of the first and second optical partial elements.

16. The apparatus of claim 10, further comprising an absorption layer configured to absorb the heating radiation, wherein the absorption layer is between the first and second partial elements.

17. The apparatus of claim 1, wherein the first optical element is a mirror, and the apparatus is an EUV semiconductor microlithography projection exposure apparatus.

18. The apparatus of claim 17, wherein the mirror has channels through with the fluid can flow during use of the apparatus.

19. The apparatus of claim 1, wherein the member comprises the absorbent element.

20. The apparatus of claim 19, wherein the apparatus has a housing with a window, and the absorbent element is outside the housing so that non-absorbed portions of the heating radiation can pass through the window before being absorbed by the absorbent element.

21. The apparatus of claim 1, wherein the member comprises the reflective elements.

22. The apparatus of claim 1, comprising:
an illumination device; and
a projection objective, the projection objective comprising the first optical element.

23. An apparatus, comprising:
a first optical element;
a first mechanism configured to heat the first optical element by irradiating the first optical element with heating radiation;
a second mechanism configured to flow a fluid along a surface of the first optical element to dissipate heat from the first optical element; and
a heat sink,
wherein:
the first optical element comprises first and second partial elements thermally contacting each other;
the second partial element has a higher thermal conductivity than the first partial element;
the heat sink and the second partial element dissipate heat from the first optical component during use of the apparatus;
during use of the apparatus, the heating radiation passes through the fluid before reaching the first optical element and
the apparatus is a semiconductor microlithography projection exposure apparatus.

24. The apparatus of claim 23, wherein the fluid comprises a gas.

25. The apparatus of claim 24, wherein the gas comprises hydrogen and/or argon.

26. The apparatus of claim 24, wherein, during use of the apparatus, the gas has a pressure of from 3 to 4 pascals.

27. The apparatus of claim 23, further comprising a second optical element, wherein the second mechanism is configured so that the fluid flows between the first and second optical elements during use of the apparatus.

28. The apparatus as of claim 27, wherein:
the first optical element has a first plane surface;
the second optical element has a second plane surface; and
the second mechanism is configured so that, as the fluid flows between the first and second optical elements during use of the apparatus, the fluid is bordered by the first and second plane surfaces.

29. The apparatus of claim 27, wherein a first surface of the first optical element and a second surface of the second optical element define a channel through with the fluid flows during use of the apparatus, and the first mechanism is configured so that the heating radiation is directed onto the first and second surfaces.

30. The apparatus of claim 23, wherein the fluid flows parallel to a surface of the first optical element during use of the apparatus.

31. The apparatus of claim 23, wherein a direction of the fluid flow has a component which is oriented perpendicular to the surface of the first optical element during use of the apparatus.

32. The apparatus of claim 23, wherein the second partial element comprises calcium fluoride.

33. The apparatus of claim 32, wherein the first partial element comprises quartz glass.

34. The apparatus of claim 23, wherein the heating radiation is directed onto a side of the first partial element which is remote from the second partial element.

35. The apparatus of claim 23, wherein the heating radiation is directed onto a surface of the first partial element which is thermally linked to the second partial element.

36. The apparatus of claim 23, further comprising an absorption layer configured to absorb the heating radiation, wherein the absorption layer is supported by one of the first and second optical partial elements.

37. The apparatus of claim 23, further comprising an absorption layer configured to absorb the heating radiation, wherein the absorption layer is between the first and second partial elements.

38. The apparatus of claim 23, wherein the first optical element is a mirror, and the apparatus is an EUV semiconductor microlithography projection exposure apparatus.

39. The apparatus of claim 38, wherein the mirror has channels through with the fluid can flow during use of the apparatus.

40. The apparatus of claim 23, comprising:
an illumination device; and
a projection objective, the projection objective comprising the first optical element.

41. An apparatus, comprising:
a first optical element;
a second optical element;
a first mechanism configured to heat the first optical element by irradiating the first optical element with heating radiation;
a second mechanism configured to flow a fluid along a surface of the first optical element to dissipate heat from the first optical element; and
a member,
wherein:
the second mechanism is configured so that the fluid flows between the first and second optical elements during use of the apparatus;
a first surface of the first optical element and a second surface of the second optical element define a channel through with the fluid flows during use of the apparatus, and the first mechanism is configured so that the heating radiation is directed onto the first and second surfaces;
the apparatus is a semiconductor microlithography projection exposure apparatus; and
the member is selected from the group consisting of:
an absorbent element configured to absorb the heating radiation, the absorbent element being configured to absorb portions of the heating radiation not absorbed by the first optical element; and
reflective elements configured to direct non-absorbed portions of the heating radiation onto the first optical element or different components of the apparatus.

42. The apparatus of claim 41, wherein the fluid comprises a gas.

* * * * *